US011244643B2

(12) United States Patent
Wang et al.

(10) Patent No.: US 11,244,643 B2
(45) Date of Patent: Feb. 8, 2022

(54) SHIFT REGISTER CIRCUIT AND METHOD OF CONTROLLING THE SAME, GATE DRIVING CIRCUIT, AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Zixuan Wang, Beijing (CN); Peng Chen, Beijing (CN); Tong Yang, Beijing (CN); Xianrui Qian, Beijing (CN); Yuting Chen, Beijing (CN); Suzhen Mu, Beijing (CN); Zhou Rui, Beijing (CN); Xiong Xiong, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

(*) Notice: Subject to any disclaimer, the term of this patent is extended or adjusted under 35 U.S.C. 154(b) by 181 days.

(21) Appl. No.: 16/179,671

(22) Filed: Nov. 2, 2018

(65) Prior Publication Data
US 2019/0213970 A1 Jul. 11, 2019

(30) Foreign Application Priority Data
Jan. 10, 2018 (CN) .......................... 201810021939.4

(51) Int. Cl.
*G11C 19/00* (2006.01)
*G09G 3/36* (2006.01)
(Continued)

(52) U.S. Cl.
CPC ............. *G09G 3/3677* (2013.01); *G09G 3/20* (2013.01); *G09G 3/3674* (2013.01); *G11C 19/28* (2013.01);
(Continued)

(58) Field of Classification Search
None
See application file for complete search history.

(56) References Cited

U.S. PATENT DOCUMENTS 6,295,046 B1 * 9/2001 Hebiguchi ........... G11C 19/184
345/100
7,949,086 B2 * 5/2011 Tsai ....................... G11C 19/28
377/64
(Continued)

FOREIGN PATENT DOCUMENTS

CN 104464666 A 3/2015
CN 106157920 A 11/2016
(Continued)

OTHER PUBLICATIONS

First Office Action issued in corresponding Chinese Application No. 201810021939.4, dated Jan. 6, 2020, with English translation.

*Primary Examiner* — Tuan T Lam
(74) *Attorney, Agent, or Firm* — McDermott Will and Emery LLP

(57) ABSTRACT

A shift register circuit includes a pull-up control sub-circuit, a pull-up sub-circuit and a shutdown auxiliary sub-circuit. The pull-up control sub-circuit is configured to transmit a voltage from the signal input terminal to the pull-up node under the control of the voltage from the signal input terminal. The shut-down auxiliary sub-circuit is configured to pull down a voltage of the pull-up node to a voltage of the discharge voltage terminal under the control of a voltage from the pull-up node. The pull-up sub-circuit is configured to transmit a voltage from the clock signal terminal to the
(Continued)

first signal output terminal under the control of a voltage from the pull-up node. The first signal output terminal is configured to be connected to a gate line.

4 Claims, 9 Drawing Sheets

(51) Int. Cl.
*G11C 19/28* (2006.01)
*G09G 3/20* (2006.01)

(52) U.S. Cl.
CPC .............. *G09G 2310/0267* (2013.01); *G09G 2310/0286* (2013.01); *G09G 2310/06* (2013.01); *G09G 2310/08* (2013.01); *G09G 2320/0257* (2013.01)

(56) References Cited

U.S. PATENT DOCUMENTS

| | | | | |
|---|---|---|---|---|
| 8,199,870 | B2* | 6/2012 | Shang | G11C 19/184 |
| | | | | 377/64 |
| 8,558,778 | B2* | 10/2013 | Yoshii | G09G 3/20 |
| | | | | 345/100 |
| 8,633,888 | B2* | 1/2014 | Kim | G09G 3/344 |
| | | | | 345/100 |
| 8,773,345 | B2* | 7/2014 | Lebrun | G11C 19/184 |
| | | | | 345/100 |
| 9,373,414 | B2* | 6/2016 | Shang | G11C 19/28 |
| 9,685,134 | B2* | 6/2017 | Zhang | G11C 19/28 |
| 10,032,428 | B2* | 7/2018 | Yamazaki | G09G 3/3696 |
| 10,269,290 | B2* | 4/2019 | Shang | G09G 3/2092 |
| 10,292,749 | B2* | 5/2019 | Shim | A61M 5/14 |
| 2006/0290390 | A1* | 12/2006 | Jang | G11C 19/28 |
| | | | | 327/112 |
| 2007/0248205 | A1* | 10/2007 | Deane | G09G 3/3677 |
| | | | | 377/70 |
| 2008/0101529 | A1* | 5/2008 | Tobita | G09G 3/3677 |
| | | | | 377/64 |
| 2008/0219401 | A1* | 9/2008 | Tobita | G09G 3/3677 |
| | | | | 377/79 |
| 2010/0226473 | A1* | 9/2010 | Liu | G11C 19/28 |
| | | | | 377/79 |
| 2011/0255653 | A1* | 10/2011 | Chae | G09G 3/3677 |
| | | | | 377/79 |
| 2013/0028370 | A1* | 1/2013 | Kikuchi | G09G 3/3677 |
| | | | | 377/64 |
| 2014/0091997 | A1* | 4/2014 | Han | G09G 3/3611 |
| | | | | 345/92 |
| 2015/0002504 | A1* | 1/2015 | Jo | G09G 3/3677 |
| | | | | 345/213 |
| 2015/0116194 | A1* | 4/2015 | Matsui | G11C 19/28 |
| | | | | 345/100 |
| 2016/0155422 | A1* | 6/2016 | Sun | G09G 3/20 |
| | | | | 345/213 |
| 2016/0307641 | A1* | 10/2016 | Zheng | G09G 3/3677 |
| 2017/0031477 | A1 | 2/2017 | Jamshidi Roudbari et al. | |
| 2017/0309240 | A1* | 10/2017 | Zhang | G09G 3/3648 |
| 2019/0057755 | A1 | 2/2019 | Xiong et al. | |
| 2019/0108809 | A1* | 4/2019 | Zheng | G11C 19/28 |

FOREIGN PATENT DOCUMENTS

| | | |
|---|---|---|
| CN | 106486085 A | 3/2017 |
| CN | 106504720 A | 3/2017 |
| CN | 107564491 A | 1/2018 |

* cited by examiner

ND DISPLAY DEVICE

SHIFT REGISTER CIRCUIT AND METHOD OF CONTROLLING THE SAME, GATE DRIVING CIRCUIT, AND DISPLAY DEVICE

CROSS-REFERENCE TO RELATED APPLICATION

This application claims priority to Chinese Patent Application No. 201810021939.4, filed on Jan. 10, 2018, titled "SHIFT REGISTER CIRCUIT AND METHOD OF CONTROLLING THE SAME, GATE DRIVING CIRCUIT, AND DISPLAY DEVICE", which is incorporated herein by reference in its entirety.

TECHNICAL FIELD

The present disclosure relates to the field of display technologies, and in particular, to a shift register circuit and a method of controlling the same, a gate driving circuit, and a display device.

BACKGROUND

As a flat panel display device, Thin Film Transistor Liquid Crystal Display (TFT-LCD) is increasingly used in high-performance display field due to its small size, low power consumption, no radiation, and relatively low manufacturing cost and the like.

SUMMARY

In an aspect, a shift register circuit is provided, and the shift register circuit includes a pull-up control sub-circuit, a pull-up sub-circuit and a shutdown auxiliary sub-circuit circuit. The pull-up control sub-circuit is connected to a signal input terminal and a pull-up node, and the pull-up control sub-circuit is configured to transmit a voltage from the signal input terminal to the pull-up node under the control of the voltage from the signal input terminal. The shutdown auxiliary sub-circuit is connected to the pull-up node and a discharge voltage terminal, and the shutdown auxiliary sub-circuit is configured to pull down a voltage of the pull-up node to a voltage of the discharge voltage terminal under the control of the voltage from the pull-up node in a shutdown control phase. The pull-up sub-circuit is connected to a clock signal terminal, the pull-up node and a first signal output terminal, and the pull-up sub-circuit is configured to transmit a voltage from the clock signal terminal to the first signal output terminal under the control of a voltage from the pull-up node. The first signal output terminal is configured to be connected to a gate line.

In some embodiments, the shutdown auxiliary sub-circuit includes a discharge transistor. A gate electrode and a first electrode of the discharge transistor are connected to the pull-up node, and a second electrode of the discharge transistor is connected to the discharge voltage terminal.

In some embodiments, the discharge voltage terminal is connected to the clock signal terminal. Alternatively, the discharge voltage terminal is connected to a ground terminal.

In some embodiments, the pull-up sub-circuit includes a driving transistor and a storage capacitor. A gate electrode of the driving transistor is connected to the pull-up node, a first electrode of the driving transistor is connected to the clock signal terminal, and a second electrode of the driving transistor is connected to the first signal output terminal. One end of the storage capacitor is connected to the gate electrode of the driving transistor, and another end of the storage capacitor is connected to the second electrode of the driving transistor. The pull-up control sub-circuit includes a first transistor. A gate electrode and a first electrode of the first transistor are connected to the signal input terminal, and a second electrode of the first transistor is connected to the pull-up node.

In some embodiments, the shift register circuit further includes a first reset sub-circuit. The first reset sub-circuit is connected to a general reset signal terminal, the pull-up node and a first voltage terminal, and the first reset sub-circuit is configured to pull down a voltage of the pull-up node to a voltage of the first voltage terminal under the control of a voltage from the general reset signal terminal. The first reset sub-circuit includes a second transistor. A gate electrode of the second transistor is connected to the general reset signal terminal, a first electrode of the second transistor is connected to the pull-up node, and a second electrode of the second transistor is connected to the first voltage terminal.

In some embodiments, the shutdown auxiliary sub-circuit includes a discharge transistor, and a width-to-length ratio of the discharge transistor is smaller than a width-to-length ratio of the second transistor.

In some embodiments, the shift register circuit further includes a first pull-down control sub-circuit. The first pull-down control sub-circuit is connected to a second voltage terminal, the signal input terminal, the pull-up node, a first pull-down node and a first voltage terminal. The first pull-down control sub-circuit is configured to transmit a voltage from the second voltage terminal to the first pull-down node under the control of the voltage from the second voltage terminal, and the first pull-down control sub-circuit is further configured to pull down a voltage of the first pull-down node to a voltage of the first voltage terminal under the control of the voltage from the signal input terminal or a voltage from the pull-up node. The first pull-down control sub-circuit includes a third transistor, a fourth transistor and a fifth transistor. A gate electrode and a first electrode of the third transistor are connected to the second voltage terminal, and a second electrode of the third transistor is connected to the pull-down node. A gate electrode of the fourth transistor is connected to the signal input terminal, a first electrode of the fourth transistor is connected to the pull-up node, and a second electrode of the fourth transistor is connected to the first voltage terminal. A gate electrode of the fifth transistor is connected to the pull-up node, a first electrode of the fifth transistor is connected to the first pull-down node, and a second electrode of the fifth transistor is connected to the first voltage terminal.

In some embodiments, the shift register circuit further includes a first pull-down sub-circuit. The first pull-down sub-circuit is connected to the pull-up node, the first signal output terminal, a first voltage terminal and a first pull-down node. The first pull-down sub-circuit is configured to pull down voltages of the pull-up node and the first signal output terminal to a voltage of the first voltage terminal under the control of a voltage from the first pull-down node. The first pull-down sub-circuit includes a sixth transistor and a seventh transistor. A gate electrode of the sixth transistor is connected to the first pull-down node, a first electrode of the sixth transistor is connected to the pull-up node, and a second electrode of the sixth transistor is connected to the first voltage terminal. A gate electrode of the seventh transistor is connected to the first pull-down node, a first electrode of the seventh transistor is connected to the first signal output terminal, and a second electrode of the seventh transistor is connected to the first voltage terminal.

In some embodiments, the shift register circuit further includes a second pull-down control sub-circuit. The second pull-down control sub-circuit is connected to a third voltage terminal, the signal input terminal, the pull-up node, a second pull-down node and a first voltage terminal. The second pull-down control sub-circuit is configured to transmit a voltage from the third voltage terminal to the second pull-down node under the control of the voltage from the third voltage terminal, and the second pull-down control sub-circuit is further configured to pull down a voltage of the second pull-down node to a voltage of the first voltage terminal under the control of a voltage from the signal input terminal or a voltage from the pull-up node. The second pull-down control sub-circuit includes an eighth transistor, a ninth transistor and a tenth transistor. A gate electrode and a first electrode of the eighth transistor are connected to the third voltage terminal, and a second electrode of the eighth transistor is connected to the second pull-down node. A gate electrode of the ninth transistor is connected to the signal input terminal, a first electrode of the ninth transistor is connected to the second pull-down node, and a second electrode of the ninth transistor is connected to the first voltage terminal. A gate electrode of the tenth transistor is connected to the pull-up node, a first electrode of the tenth transistor is connected to the second pull-down node, and a second electrode of the tenth transistor is connected to the first voltage terminal.

In some embodiments, the shift register circuit further includes a second pull-down sub-circuit. The second pull-down sub-circuit is connected to the pull-up node, the first signal output terminal, a first voltage terminal and a second pull-down node. The second pull-down sub-circuit is configured to pull down voltages of the pull-up node and the first signal output terminal to a voltage of the first voltage terminal under the control of a voltage from the second pull-down node. The second pull-down sub-circuit includes an eleventh transistor and a twelfth transistor. A gate electrode of the eleventh transistor is connected to the second pull-down node, a first electrode of the eleventh transistor is connected to the pull-up node, and a second electrode of the eleventh transistor is connected to the first voltage terminal. A gate electrode of the twelfth transistor is connected to the second pull-down node, a first electrode of the twelfth transistor is connected to the first signal output terminal, and a second electrode of the twelfth transistor is connected to the first voltage terminal.

In some embodiments, the pull-up sub-circuit is further connected to a second signal output terminal. The pull-up sub-circuit further includes a thirteenth transistor. A gate electrode of the thirteenth transistor is connected to the pull-up node, a first electrode of the thirteenth transistor is connected to the clock signal terminal, and a second electrode of the thirteenth transistor is connected to the second signal output terminal. The first pull-down sub-circuit further includes a fourteenth transistor. A gate electrode of the fourteenth transistor is connected to the first pull-down node, a first electrode of the fourteenth transistor is connected to the second signal output terminal, and a second electrode of the fourteenth transistor is connected to the first voltage terminal.

In some embodiments, the pull-up sub-circuit is further connected to a second signal output terminal. The pull-up sub-circuit further includes a thirteenth transistor. A gate electrode of the thirteenth transistor is connected to the pull-up node, a first electrode of the thirteenth transistor is connected to the clock signal terminal, and a second electrode of the thirteenth transistor is connected to the second signal output terminal. The second pull-down sub-circuit further includes a fifteenth transistor. A gate electrode of the fifteenth transistor is connected to the second pull-down node, a first electrode of the fifteenth transistor is connected to the second signal output terminal, and the second electrode of the fifteenth transistor is connected to the first voltage terminal.

In some embodiments, the shift register circuit further includes a second reset sub-circuit. The second reset sub-circuit is connected to a first sub-reset signal terminal, a second sub-reset signal terminal, the pull-up node, the first signal output terminal and a first voltage terminal. The second reset sub-circuit is configured to pull down a voltage of the first signal output terminal to a voltage of the first voltage terminal under the control of a voltage from the first sub-reset signal terminal, and the second reset sub-circuit is further configured to pull down a voltage of the pull-up node to a voltage of the first voltage terminal under the control of a voltage from the second sub-reset signal terminal. The second reset sub-circuit includes a sixteenth transistor and a seventeenth transistor. A gate electrode of the sixteenth transistor is connected to the second sub-reset signal terminal, a first electrode of the sixteenth transistor is connected to the pull-up node, and a second electrode of the sixteenth transistor is connected to the first voltage terminal. A gate electrode of the seventeenth transistor is connected to the first sub-reset signal terminal, a first electrode of the seventeenth transistor is connected to the first signal output terminal, and a second electrode of the seventeenth transistor is connected to the first voltage terminal.

In another aspect, a gate driving circuit is provided, and the gate driving circuit includes a plurality of cascaded shift register circuits described above. A pull-up sub-circuit in each shift register circuit is further connected to a second signal output terminal. The shift register circuit further includes a second reset sub-circuit, and the second reset sub-circuit is connected to a first sub-reset signal terminal, a second sub-reset signal terminal, the pull-up node, the first signal output terminal and the first voltage terminal. A signal input terminal of a first-stage shift register circuit is configured to receive a start signal. Except for the first-stage shift register circuit, a second signal output terminal of a shift register circuit in a previous stage is connected to a signal input terminal of a shift register circuit in a next stage. Except for a last-stage shift register circuit, a first signal output terminal of a shift register circuit in a next stage is connected to a first sub-reset signal terminal of a shift register circuit in a previous stage, and a second signal output terminal of the shift register circuit in the next stage is connected to a second sub-reset signal terminal of the shift register circuit in the previous stage. A first sub-reset signal terminal and a second sub-reset signal terminal of the last-stage shift register circuit is configured to receive reset signals.

In yet another aspect, a display device is provided, and the display device includes the gate driving circuit described above.

In yet another aspect, a method of controlling the shift register circuit described above is provided. The method includes: in an image frame of a display phase: in a pre-charge phase, transmitting, by the pull-up control sub-circuit, a voltage from the signal input terminal to the pull-up node under the control of the voltage from the signal input terminal; and in a gate driving signal output phase, transmitting, by the pull-up sub-circuit, a voltage from the clock signal terminal to the first signal output terminal under the control of a voltage from the pull-up node. The method further includes: in a shutdown control phase, pulling down, by the shutdown auxiliary sub-circuit, a voltage of the pull-up node to a voltage of the discharge voltage terminal under the control of the voltage from the pull-up node.

In yet another aspect, a method of controlling the shift register circuit is provided, and the shift register circuit includes a pull-up control sub-circuit, a pull-up sub-circuit and a first reset sub-circuit. The pull-up control sub-circuit is connected to a signal input terminal and a pull-up node. The pull-up sub-circuit is connected to a clock signal terminal, the pull-up node and the first signal output terminal. The first reset sub-circuit is connected to a general reset signal terminal, the pull-up node and a first voltage terminal. The method includes: in an image frame of a display phase: in a pre-charge phase, transmitting, by the pull-up control sub-circuit, a voltage from the signal input terminal to the pull-up node under the control of the voltage from the signal input terminal; in a gate driving signal output phase, transmitting, by the pull-up sub-circuit, a voltage of the clock signal terminal to the first signal output terminal under the control of a voltage from the pull-up node; and in a phase before a shutdown control phase, pulling down, by the reset sub-circuit, a voltage of the pull-up node to a voltage of the first voltage terminal under the control of a voltage from the general reset signal terminal.

BRIEF DESCRIPTION OF THE DRAWINGS

In order to describe the technical solution in embodiments of the present disclosure more clearly, the accompanying drawings to be used in the description of embodiments will be introduced briefly. Obviously, the accompanying drawings to be described below are merely some embodiments of the present disclosure, and a person of ordinary skill in the art can obtain other drawings according to these drawings without paying any creative effort.

DETAILED DESCRIPTION

The technical solution in embodiments of the present disclosure will be described clearly and completely with reference to the accompanying drawings in embodiments of the present disclosure. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

In this specification, the numerical terms such as "first," "second," etc. may be added as prefixes. These prefixes, however, are only added in order to distinguish the terms and do not have specific meaning such as order and relative merits.

The TFT-LCD may have a shutdown afterimage in a shutdown process. In the related art, in order to solve the problem of shutdown afterimage, each of shift register circuits in a Gate Driver on Array (GOA) controls a corresponding row of sub-pixels to be turned on before shutdown. Thereby, the electric charges on the pixel electrodes in the sub-pixels are discharged to the data lines, and the shutdown afterimage is eliminated.

However, operating states of the shift register circuits are not exactly the same before shutdown. For example, pull-up nodes in multiple shift register circuits of the shift register circuits are in pre-charge states. When the process of eliminating the shutdown afterimage described above is performed, the pull-up nodes in pre-charge states may be bootstrapped so that their voltages are much higher than the voltages of the pull-up nodes in other shift register circuits. In this case, after the end of the process of eliminating the shutdown afterimage, the voltages of the clock signal terminals of the multiple the shift register circuits are rapidly pulled down to a zero voltage. In this case, the pull-up nodes with larger voltages will control the output signals of respective shift register circuits where they are respectively located to be discharged rapidly, while the output signals of other shift register circuits are discharged slowly. As a result, the discharge speeds of rows of sub-pixels are inconsistent, which leads to the problems of a shutdown splash screen and a horizontal afterimage.

Figure 1:
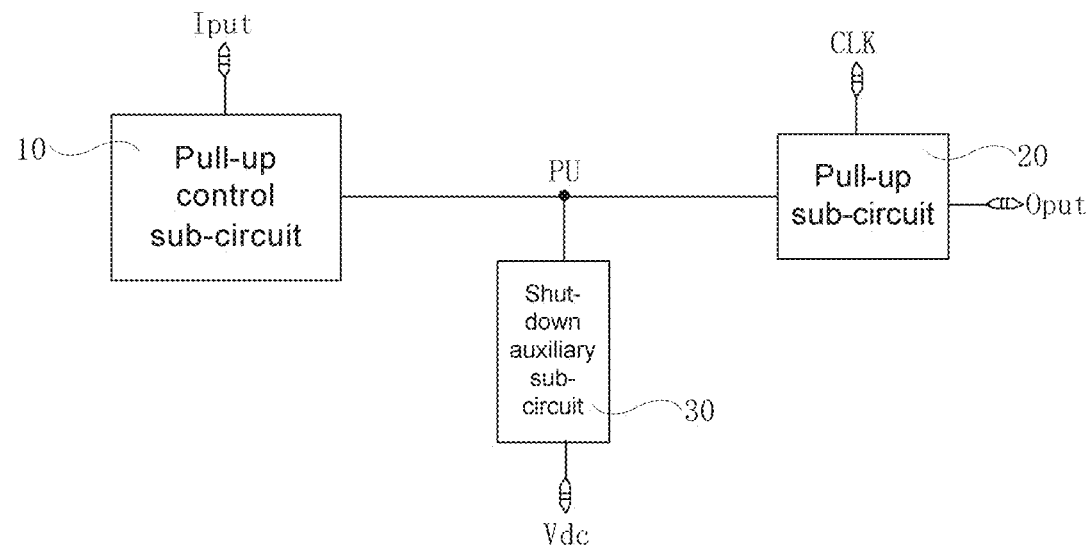
FIG. 1 is a schematic structural diagram of a shift register circuit according to some embodiments of the present disclosure.

Some embodiments of the present disclosure provide a shift register circuit. As shown in FIG. 1, the shift register circuit includes a pull-up control sub-circuit 10 and a pull-up sub-circuit 20.

The pull-up control sub-circuit 10 is connected to a signal input terminal INPUT (represented by Iput hereinafter and in the figures) and a pull-up node PU. The pull-up control sub-circuit 10 is configured to transmit a voltage from the signal input terminal Iput to the pull-up node PU under the control of the voltage from the signal input terminal Iput to pre-charge the pull-up node PU.

Figure 2:
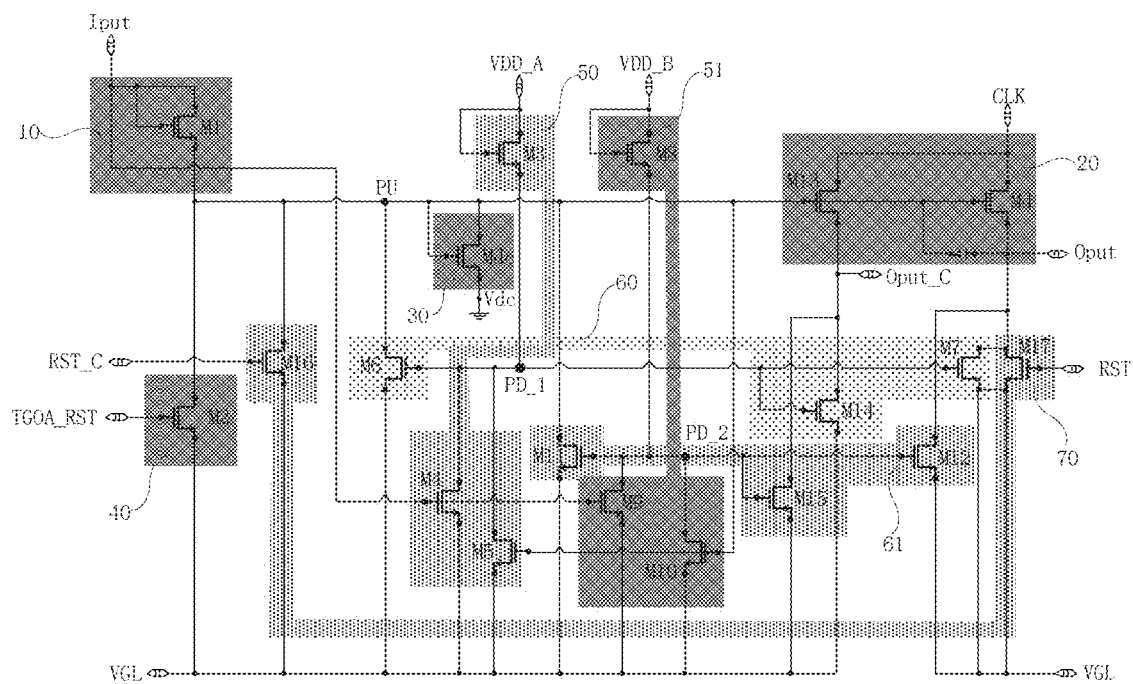
FIG. 2 is a schematic diagram showing structures of sub-circuits in FIG. 1.

In some embodiments, as shown in FIG. 2, the pull-up control sub-circuit 10 includes a first transistor M1. The first transistor M1 includes a gate electrode, a first electrode and a second electrode. The gate electrode and the first electrode of the first transistor M1 are connected to the signal input terminal Iput, and the second electrode of the first transistor M1 is connected to the pull-up node PU.

On this basis, the pull-up sub-circuit 20 is connected to a clock signal terminal CLK, the pull-up node PU and a first signal output terminal OUT (also referred to as OUTPUT, and represented by Oput hereinafter and in the figures). The pull-up sub-circuit 20 is configured to transmit a voltage from the clock signal terminal CLK to the first signal output terminal Oput under the control of a voltage from the pull-up node PU. The first signal output terminal Oput is configured to be connected to a gate line in a display region. In this case, taking an example in which TFTs in sub-pixels connected to the gate line described above in the display region are N-type transistors, when a high level input via the clock signal terminal CLK described above is transmitted to the first signal output terminal Oput through the pull-up sub-circuit 20, the high level input via the clock signal terminal CLK may be used as a gate driving signal to turn on a row of sub-pixels connected to the gate line.

In some embodiments, as shown in FIG. 2, the pull-up sub-circuit 20 includes a driving transistor Md and a storage capacitor C.

The driving transistor Md includes a gate electrode, a first electrode and a second electrode. The gate electrode of the driving transistor Md is connected to the pull-up node PU, the first electrode of the driving transistor Md is connected to the clock signal terminal CLK, and the second electrode of the driving transistor Md is connected to the first signal output terminal Oput.

One end of the storage capacitor C is connected to the gate electrode of the driving transistor Md, and another end of the storage capacitor C is connected to the second electrode of the driving transistor Md.

Figure 4:
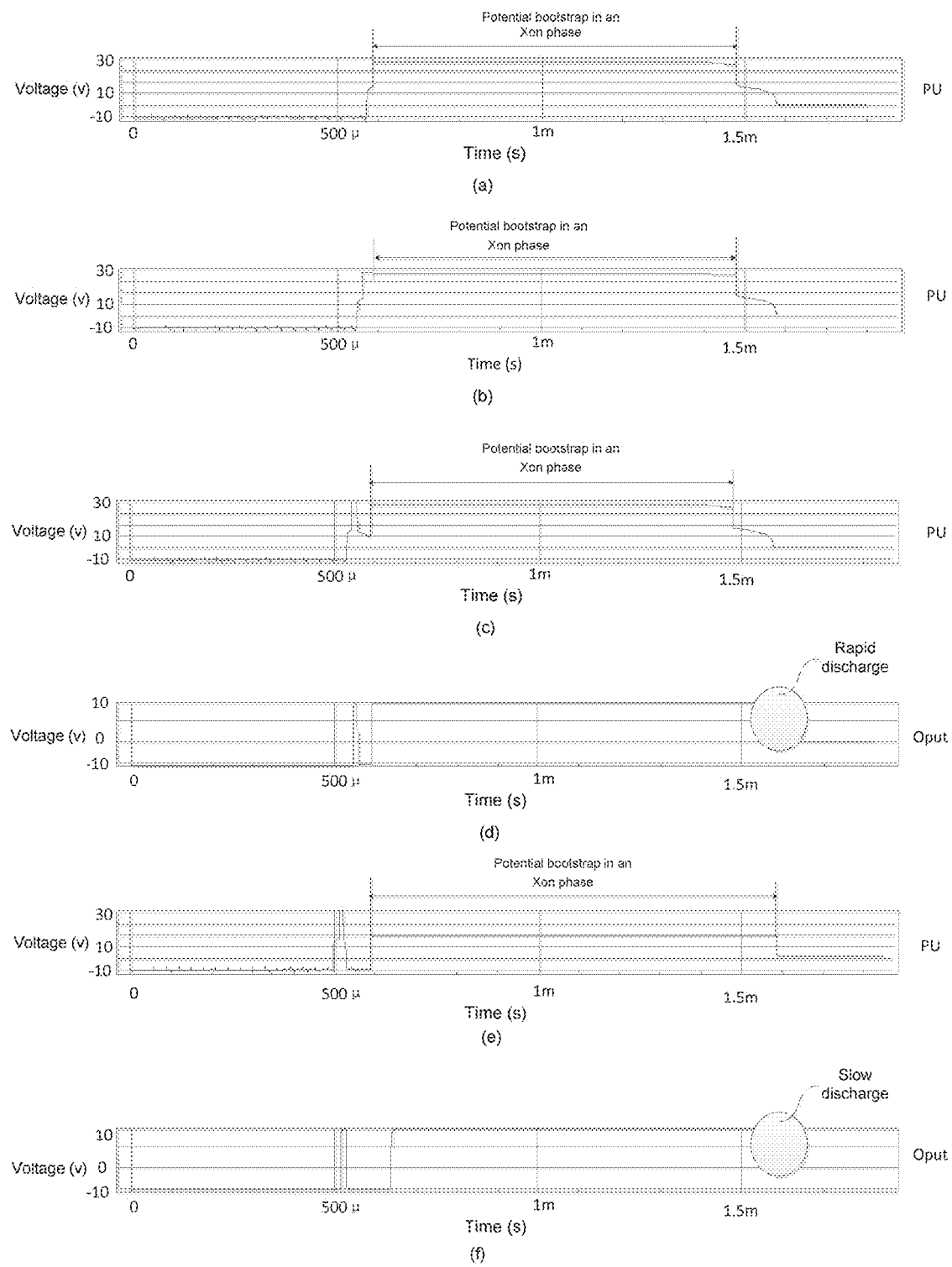
FIG. 4 shows timing diagrams of signals of the pull-up node and the first signal output terminal of the shift register circuit shown in FIG. 2 in different states.

Regarding some of the shift register circuits constituting the gate driving circuits, referring to (a) in FIG. 4, in a display phase before a shutdown control phase Xon, the pull-up control sub-circuit 10 of each of these shift register circuits transmits the voltage of the signal input terminal Iput to the pull-up node PU to pre-charge the pull-up node PU (in this case, the shift register circuit is in a precharge state). For example, the pull-up node PU is charged to 18V. Then in the shutdown control phase Xon, since the voltage input via the clock signal terminal CLK is switched from a low level to a high level, a potential of the pull-up node PU is bootstrapped under a bootstrap action of the storage capacitor C in the pull-up sub-circuit 20. Thereby, the voltage of the pull-up node PU as shown in (a) of FIG. 4 is further raised. For example, it is raised to about 30V.

Regarding some other ones of the shift register circuits constituting the gate driving circuits, referring to (b) in FIG. 4, in the display phase before the shutdown control phase Xon, the pull-up control sub-circuit 10 in each of these shift register circuits is turned off, and the pull-up sub-circuit 20 thereof is turned on and transmits the high level input via the clock signal terminal CLK to the first signal output terminal Oput as a gate driving signal. In this case, the potential of the pull-up node PU is raised under the bootstrap action of the storage capacitor C. As shown in (b) of FIG. 4, the voltage of the pull-up node PU has been raised to 30 V before the shutdown control phase Xon. Then, in the shutdown control phase Xon, since a high level is continually input via the clock signal terminal CLK, the voltage of the pull-up node PU is maintained at 30V.

Regarding yet some ones of the shift register circuits constituting the gate driving circuits, referring to (c) in FIG. 4, in the display phase before the shutdown control phase Xon described above, although each of these shift register circuits transmits the gate driving signal to the first signal output terminal Oput, since the potentials of the first signal output terminal Oput and the pull-up node PU have not been reset, in this case, as shown in (c) in FIG. 4, the potential of the pull-up node PU drops to some extent before the shutdown control phase Xon, and is not reset to a low level (for example, −10V). In this case, in the shutdown control phase Xon, since the voltage input via the clock signal terminal CLK is switched from a low level to a high level, the potential of the pull-up node PU is bootstrapped under the bootstrap action of the storage capacitor C in the pull-up sub-circuit 20. Thereby, the voltage of the pull-up node PU is raised, for example, it is raised to about 30V.

It can be seen from above that the bootstrap phenomenon of the pull-up node PU may occur in the shutdown control phase Xon, or in the display phase before the shutdown control phase Xon. In a case where the bootstrap phenomenon of the pull-up node PU occurs in the display phase before the shutdown control phase Xon, the potential of the pull-up node PU, i.e., the potential bootstrapped in the display phase, is maintained to the shutdown control phase Xon.

Referring to a waveform of the voltage of the pull-up node PU shown in (c) of FIG. 4, since the potential of the pull-up node PU is bootstrapped in the shutdown control phase, under the control of the pull-up node PU having a higher voltage, the driving transistor Md is in a fully turned-on state, and the signal transmission efficiency is high. In this way, as shown in (d) of FIG. 4, in the shutdown control phase Xon, when a high level is input via the clock signal terminal CLK, the high level may be rapidly transmitted to the first signal output terminal Oput through the turned-on driving transistor Md. Moreover, when the shutdown control phase Xon ends, the voltage of the clock signal terminal CLK is pulled down to 0V. In this case, the signal input via the first signal output terminal Oput may be rapidly pulled down to 0V through the turned-on driving transistor Md. Therefore, if the potential of the pull-up node PU is bootstrapped in the shutdown control phase Xon, a discharge speed of the signal input via the first signal output terminal Oput is high. In this way, values of jumping voltages ΔVp of the pixel electrodes in one row of sub-pixels connected to the shift register circuit are relatively large, and the discharge speed of the row of sub-pixels is also high.

Similarly, referring to a waveform of the voltage of the pull-up node PU shown in (a) of FIG. 4, the potential of the pull-up node PU is bootstrapped in the shutdown control phase. Alternatively, referring to a waveform of the voltage of the pull-up node PU shown in (b) of FIG. 4, the potential of the pull-up node PU in the shutdown control phase X is maintained at the potential bootstrapped in the display phase. Thereby, under the control of the pull-up node PU having a higher voltage, the driving transistor Md is in a fully turned-on state, and the signal transmission efficiency is high. Waveforms of voltages output via the first signal output terminals Oput of the shift register circuits where different pull-up nodes PU are located respectively are similar to a waveform shown in (d) of FIG. 4, except that there is a certain time difference on the output timing.

In addition, regarding yet some ones of the shift register circuits constituting the gate driving circuit, as shown in (e) of FIG. 4, in the display phase before the shutdown control phase Xon, after the gate driving signal is output via the first signal output terminal Oput, the voltages of the pull-up node PU and the first signal output terminal Oput are pulled down to a voltage of a first voltage terminal VGL. Then in the shutdown control phase Xon, since a high level (about 18V) is input via the signal input terminal Iput, the high level input via the signal input terminal Iput is transmitted to the pull-up node PU through the first transistor M1 shown in FIG. 2, thereby as shown in (e) of FIG. 4, the voltage of the pull-up node PU is at 18V in the shutdown control phase Xon, and the potential of the pull-up node PU is not bootstrapped.

In this case, since the potential of the pull-up node PU is not bootstrapped in the shutdown control phase, under the control of the voltage from the pull-up node PU, the driving transistor Md is in a general turned-on state, and the signal transmission efficiency is relatively low. Therefore, as shown in (f) of FIG. 4, in the shutdown control phase Xon, when a high level is input via the clock signal terminal CLK, the high level input via the clock signal terminal CLK may be transmitted to the first signal output terminal Oput through the turned-on driving transistor Md. Moreover, after the shutdown control phase Xon ends, the voltage of the pull-up node PU is pulled down to 0V. In this case, the driving transistor Md gradually turns from the turned-on state to a cut-off state. Therefore, the signal output via the first signal output terminal Oput may be slowly pulled down to 0V through the driving transistor Md. Therefore, if the potential of the pull-up node PU is not bootstrapped in the shutdown control phase, the discharge speed of the signal output via the first signal output terminal Oput is slow. In this way, the values of the jumping voltages ΔVp of the pixel electrodes in one row of sub-pixels connected to the shift register circuit are relatively small, and the discharge speeds of the row of sub-pixels are also low.

It can be seen from the above description that since in the shutdown control phase Xon, some of the potentials of the pull-up nodes PU in the shift register circuits connected to different gate lines are bootstrapped, and some are not bootstrapped. Therefore, discharge time of the output signals of the shift register circuits is different, thereby the discharge speeds of the rows of the sub-pixels are not the same, so that after the shutdown control phase Xon, there still exist the problems of the shutdown splash screen and the horizontal afterimage.

In order to solve the above problems, as shown in FIG. 1, the shift register circuit provided by the embodiments of the present disclosure further includes a shutdown auxiliary sub-circuit 30.

Figure 3:
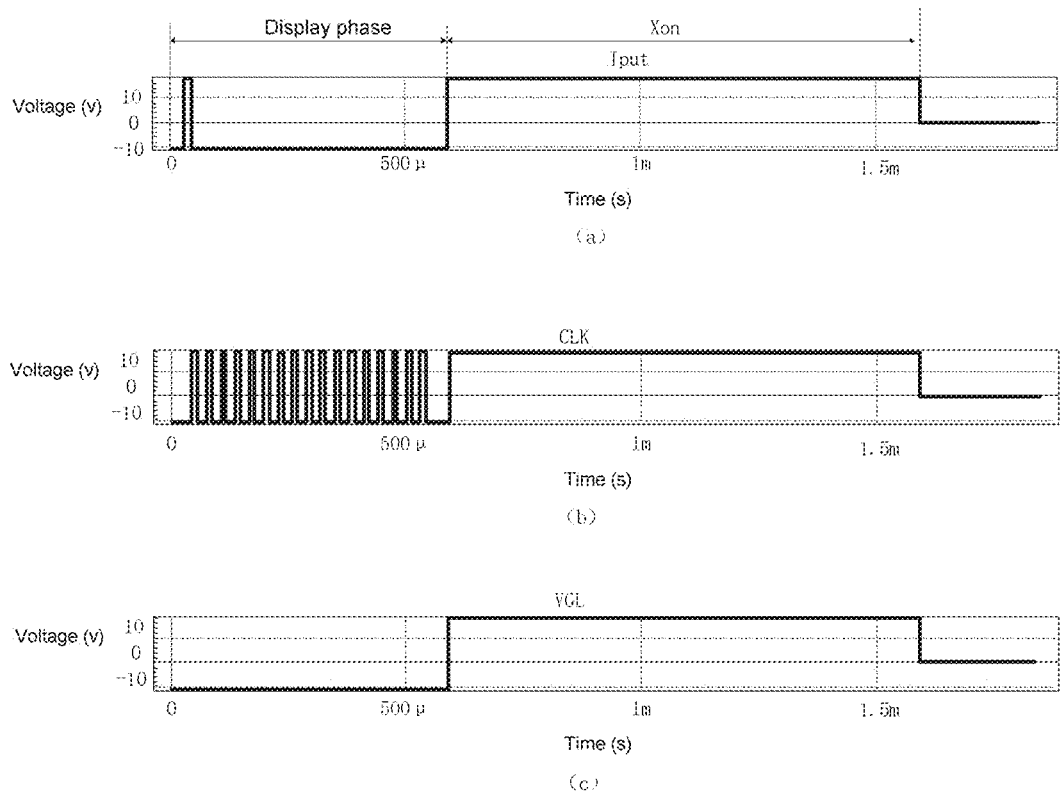
FIG. 3 shows timing diagrams of some of signals of controlling the shift register circuit shown in FIG. 2.

The shutdown auxiliary sub-circuit 30 is connected to the pull-up node PU and a discharge voltage terminal Vdc. In the shutdown control phases Xon shown in (a), (b), and (c) of FIG. 3, the shutdown auxiliary sub-circuit 30 is configured to pull down a voltage from the pull-up node PU to a voltage of the discharge voltage terminal Vdc under the control of the voltage from the pull-up node PU.

Figure 12:
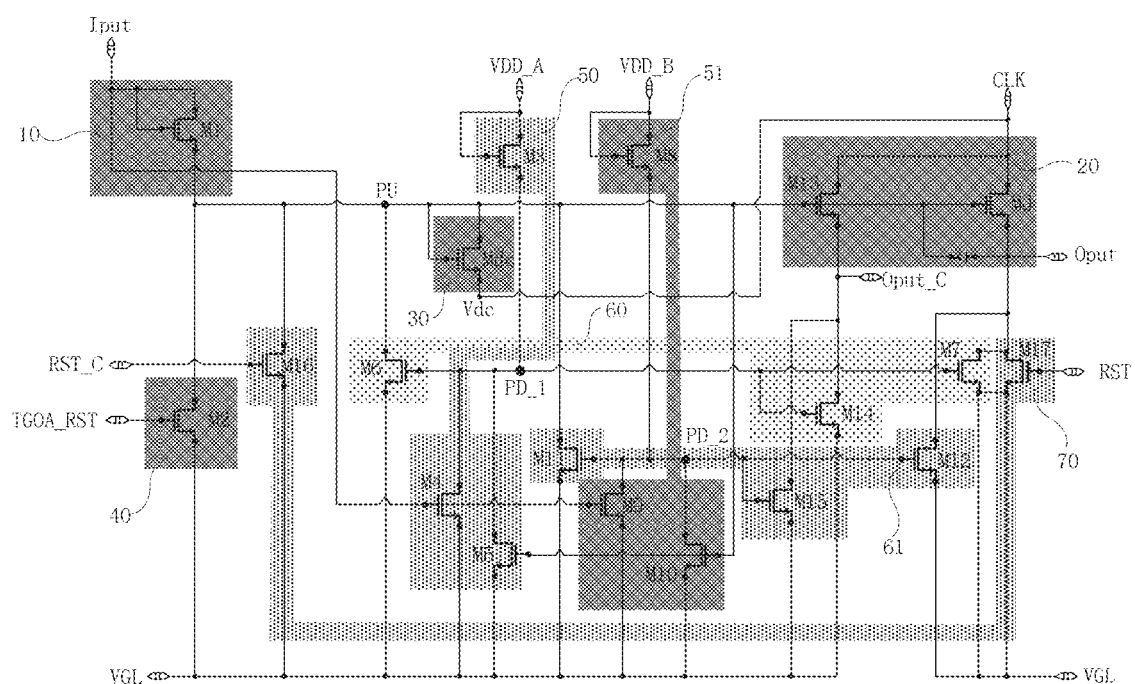
FIG. 12 is another schematic diagram showing structures of sub-circuits in FIG. 1.

In some embodiments, as shown in FIG. 12, the discharge voltage terminal Vdc is connected to the clock signal terminal CLK. In some other embodiments, as shown in FIG. 2, the discharge voltage terminal Vdc is connected to a ground terminal GND.

In some embodiments, as shown in FIG. 2, the shutdown auxiliary sub-circuit 30 includes a discharge transistor Mdc.

The discharge transistor Mdc includes a gate electrode, a first electrode and a second electrode. The gate electrode and the first electrode of the discharge transistor Mdc are both connected to the pull-up node PU, and the second electrode of the discharge transistor Mdc is connected to the discharge voltage terminal Vdc described above.

In this case, taking an example in which the TFTs connected to the gate line in the display region are N type transistors. In the shutdown control phase Xon, high levels (for example, about 18V) are input via the signal input terminal Iput, the clock signal terminal CLK and the first voltage terminal VGL respectively as shown in (a), (b), and (c) of FIG. 3. A low level may be input via the first voltage terminal (for example, about −10V) in the display phase.

It will be seen from the above description that on the one hand, since the shutdown auxiliary sub-circuit 30 may pull down the voltage of the pull-up node PU to the potential of the discharge voltage terminal Vdc in the shutdown control phase Xon, it may be avoided that a high level input via the clock signal terminal CLK in the shutdown control phase Xon causes the potentials of the pull-up nodes PU in some of the shift register circuits of the gate driving circuit to be bootstrapped. Thereby, in the shutdown control phase Xon, the potentials of the pull-up nodes PU of the shift register circuits are substantially the same. In this case, under the control of different pull-up nodes PU, the discharge speeds of the signal output respectively via the first signal output terminals Oput of the shift register circuits are uniform, thereby the jumping voltages ΔVp of the pixel electrodes in rows of sub-pixels are substantially the same, and the discharge speed of each of the sub-pixels is uniform, and the problems of the shutdown splash screen and the horizontal afterimage described above are solved.

The discharge voltage terminal Vdc is connected to the clock signal terminal CLK. In the shutdown control phase Xon, an example in which a high level (about 18V) is input via the clock signal terminal CLK is taken. Regarding a shift register circuit that is in a pre-charge phase or a gate driving signal output phase before the shutdown control phase Xon, in the shutdown control phase Xon, the pull-up node PU in the shift register circuit may control the discharge transistor Mdc 30 in the shutdown auxiliary sub-circuit 30 to be turned on, as shown in (a) of FIG. 5, thereby the voltage of the pull-up node PU is slowly pulled down, through the discharge transistor Mdc, to the voltage (about 18 V) input via the clock signal terminal CLK, so as to prevent the bootstrap of the potential of the pull-up node PU from causing the voltage of the pull-up node PU to be raised to about 30V. In this case, the waveform of the signal output via the first signal output terminal Oput of the shift register circuit is as shown in (b) of FIG. 5.

In addition, regarding a shift register circuit in which the gate driving signal has been output, and the voltages of first signal output terminal Oput and the pull-up node PU have been reset in the display phase before the shutdown control phase Xon, under the action of a high level (about 18V) input via the signal input terminal Iput in the shutdown control phase Xon, as shown in (e) of FIG. 4, the pull-up node PU in the shift register circuit is charged to the high level (about 18V). In this case, the waveform of the signal output via the first signal output terminal Oput of the shift register circuit is as shown in (f) of FIG. 4.

Figure 5:
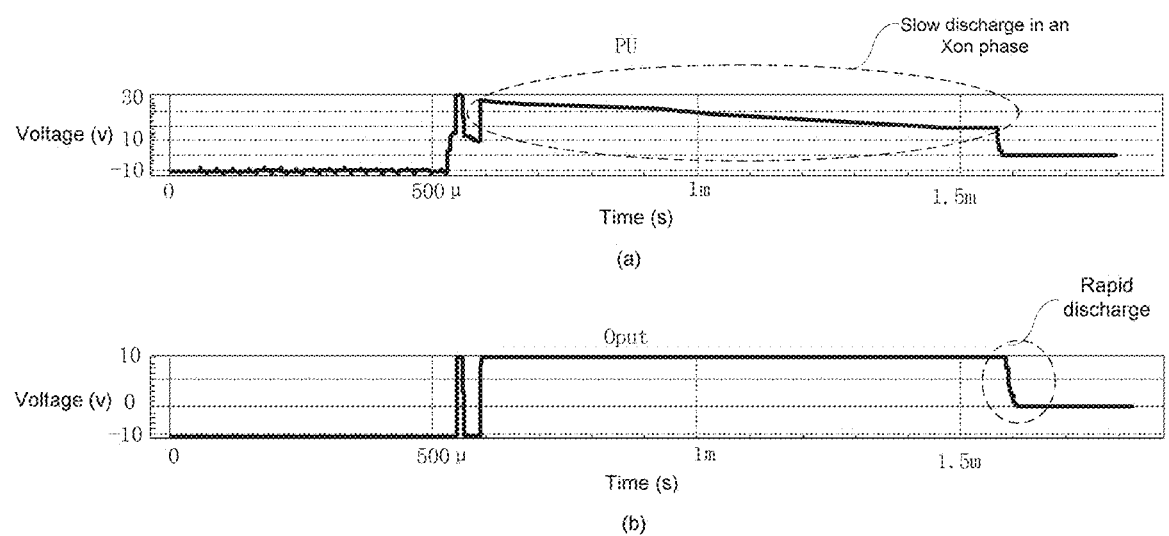
FIG. 5 shows other timing diagrams of signals of the pull-up node and the first signal output terminal of the shift register circuit shown in FIG. 2 in different states.

In this case, it can be seen from (a) of FIG. 5 that under the control of the shutdown auxiliary sub-circuit 30, even if a pull-up node PU in a shift register circuit in one stage is not reset before the shutdown control phase Xon, and the voltage of the pull-up node PU may be bootstrapped at the beginning of the shutdown control phase Xon, under the action of the shutdown auxiliary sub-circuit 30, the potential of the pull-up node PU may be gradually discharged. Thereby, the waveform of the voltage of the pull-up node PU is substantially the same as the waveforms of the voltages of the pull-up nodes PU in other shift register circuits, such as a waveform shown in (e) of FIG. 4. In this case, it can be seen from (b) in FIG. 5 and (f) in FIG. 4 that the waveforms of the signals output via the first signal output terminals Oput of the shift register circuits are substantially the same, so that the discharge speeds of the rows of sub-pixels are uniform.

It can be known from the above description that the discharge voltage terminal Vdc is connected to the clock signal terminal CLK or the ground terminal GND. In the case where the discharge voltage terminal Vdc is connected to the clock signal terminal CLK, in the shutdown control phase Xon, the potential of the pull-up node PU is pulled down to the voltage of the clock signal terminal (a high level of about 18V). In this case, the pull-up node PU may ensure that the driving transistor Md in the pull-up sub-circuit 20 is turned on. In this case, the voltage of the clock signal terminal CLK is changed to 0V after shutdown, and the driving transistor Md is not immediately cut off, so that the voltage of 0V input via the clock signal terminal CLK may be transmitted to the first signal output terminal Oput through the driving transistor Md. Thereby, it may be avoided that the first signal output terminal Oput still maintaining a high level for a period of time after shutdown leads to a slow shutdown speed.

In addition, in the shift register circuit according to the embodiments of the present disclosure, under the action of the shutdown auxiliary sub-circuit 30, the pull-up node PU will not be at a high level for a long time, so that the driving transistor Md controlled by the pull-up node PU may be prevented from being in a bias voltage state for a long time, thereby reducing the probability of a threshold voltage shift of the driving transistor Md.

Other structures of the shift register circuit described above will be described in detail below.

In some embodiments, as shown in FIG. 2, the shift register circuit further includes a first reset sub-circuit 40.

In some embodiments, the first reset sub-circuit 40 is connected to a general reset signal terminal TGOA_RST, the pull-up node PU, and the first voltage terminal VGL. The first reset sub-circuit 40 is configured to pull down a voltage of the pull-up node PU to a voltage of the first voltage terminal VGL under the control of a voltage from the general reset signal terminal TGOA_RST.

In some embodiments, the first reset sub-circuit 40 includes a second transistor M2. The second transistor M2 includes a gate electrode, a first electrode and a second electrode. The gate electrode of the second transistor M2 is connected to the general reset signal terminal TGOA_RST, the first electrode of the second transistor M2 is connected to the pull-up node PU, and the second electrode of the second transistor M2 is connected to the first voltage terminal VGL.

After an end of one frame, through the general reset signal terminal TGOA_RST of each stage of shift register circuit, a reset signal is input to the gate electrode of the second transistor M2 connected to the general reset signal terminal TGOA_RST, so that the pull-up nodes PU in all of the shift register circuits may be reset.

In some embodiments, as shown in FIG. 2, the shift register circuit further includes a first pull-down control sub-circuit 50.

The first pull-down control sub-circuit 50 is connected to a second voltage terminal VDD_A, the signal input terminal Iput, the pull-up node PU, a first pull-down node PD_1 and the first voltage terminal VGL.

In this case, the first pull-down control sub-circuit 50 is configured to transmit a voltage from the second voltage terminal VDD_A to the first pull-down node PD_1 under the control of the voltage from the second voltage terminal VDD_A. The first pull-down control sub-circuit 50 is further configured to pull down a voltage of the first pull-down node PD_1 to the voltage of the first voltage terminal VGL under the control of the voltage from the signal input terminal Iput or the voltage from the pull-up node PU.

In some embodiments, the first pull-down control sub-circuit 50 includes a third transistor M3, a fourth transistor M4 and a fifth transistor M5.

The third transistor M3 includes a gate electrode, a first electrode and a second electrode. The gate electrode and the first electrode of the third transistor M3 are connected to the second voltage terminal VDD_A, and the second electrode of the third transistor M3 is connected to the first pull-down node PD_1.

The fourth transistor M4 includes a gate electrode, a first electrode and a second electrode. The gate electrode of the fourth transistor M4 is connected to the signal input terminal Iput, the first electrode of the fourth transistor M4 is connected to the first pull-down node PD_1, and the second electrode of the fourth transistor M4 is connected to the first voltage terminal VGL.

The fifth transistor M5 includes a gate electrode, a first electrode and a second electrode. The gate electrode of the fifth transistor M5 is connected to the pull-up node PU, the first electrode of the fifth transistor M5 is connected to the first pull-down node PD_1, and the second electrode of the fifth transistor M5 is connected to the first voltage terminal VGL.

In some embodiments, as shown in FIG. 2, the shift register circuit further includes a first pull-down sub-circuit 60.

The first pull-down sub-circuit 60 is connected to the pull-up node PU, the first signal output terminal Oput, the first voltage terminal VGL and the first pull-down node PD_1. The first pull-down sub-circuit 60 is configured to pull down voltages of the pull-up node PU and the first signal output terminal Oput to a voltage of the first voltage terminal VGL under the control of the voltage from the first pull-down node PD_1.

In some embodiments, the first pull-down sub-circuit includes a sixth transistor M6 and a seventh transistor M7.

The sixth transistor M6 includes a gate electrode, a first electrode and a second electrode. The gate electrode of the sixth transistor M6 is connected to the first pull-down node PD_1, the first electrode of the sixth transistor M6 is connected to the pull-up node PU, and the second electrode of the sixth transistor M6 is connected to the first voltage terminal VGL.

The seventh transistor M7 includes a gate electrode, a first electrode and a second electrode. The gate electrode of the seventh transistor M7 is connected to the first pull-down node PD_1, the first electrode of the seventh transistor M7 is connected to the first signal output terminal Oput, and the second electrode of the seventh transistor M7 is connected to the first voltage terminal VGL.

In addition, in order to improve pull-down effects on the pull-up node PU and the first signal output terminal Oput, and reduce noise in the signal output via the first signal output terminal Oput, in some embodiments, as shown in FIG. 2, the shift register circuit further includes a second pull-down control sub-circuit 51.

The second pull-down control sub-circuit 51 is connected to a third voltage terminal VDD_B, the signal input terminal Iput, the pull-up node PU, a second pull-down node PD_2 and the first voltage terminal VGL. The second pull-down control sub-circuit 51 is configured to transmit a voltage from the third voltage terminal VDD_B to the second pull-down node PD_2 under the control of the voltage from the third voltage terminal VDD_B. The second pull-down control sub-circuit 51 is further configured to pull down a voltage of the second pull-down node PD_2 to the voltage of the first voltage terminal VGL under the control of the voltage from the signal input terminal Iput or the voltage from the pull-up node PU.

In some embodiments, the second pull-down control sub-circuit 51 includes an eighth transistor M8, a ninth transistor M9 and a tenth transistor M10.

The eighth transistor M8 includes a gate electrode, a first electrode and a second electrode. The gate electrode and the first electrode of the eighth transistor M8 are connected to the third voltage terminal VDD_B, and the second electrode of the eighth transistor M8 is connected to the second pull-down node PD_2.

The ninth transistor M9 includes a gate electrode, a first electrode and a second electrode. The gate electrode of the ninth transistor M9 is connected to the signal input terminal Iput, the first electrode of the ninth transistor M9 is connected to the second pull-down node PD_2, and the second electrode of the ninth transistor M9 is connected to the first voltage terminal VGL.

The tenth transistor M10 includes a gate electrode, a first electrode and a second electrode. The gate electrode of the tenth transistor M10 is connected to the pull-up node PU, the first electrode of the tenth transistor M10 is connected to the second pull-down node PD_2, and the second electrode of the tenth transistor M10 is connected to the first voltage terminal VGL.

In some embodiments, as shown in FIG. 2, the shift register circuit further includes a second pull-down sub-circuit 61.

The second pull-down sub-circuit 61 is connected to the pull-up node PU, the first signal output terminal Oput, the first voltage terminal VGL and the second pull-down node PD_2. The second pull-down sub-circuit 61 is configured to pull down the voltages of the pull-up node PU and the first signal output terminal Oput to the voltage of the first voltage terminal VGL under the control of the voltage from the second pull-down node PD_2.

In some embodiments, the second pull-down sub-circuit 61 includes an eleventh transistor M11 and a twelfth transistor M12.

The eleventh transistor M11 includes a gate electrode, a first electrode and a second electrode. The gate electrode of the eleventh transistor M11 is connected to the second pull-down node PD_2, the first electrode of the eleventh transistor M11 is connected to the pull-up node PU, and the second electrode of the eleven transistor M11 is connected to the first voltage terminal VGL.

The twelfth transistor M12 includes a gate electrode, a first electrode and a second electrode. The gate electrode of the twelfth transistor M12 is connected to the second pull-down node PD_2, the first electrode of the twelfth transistor M12 is connected to the first signal output terminal Oput, and the second electrode of the twelfth transistor M12 is connected to the first voltage terminal VGL.

It will be noted that high levels are alternately input via the second voltage terminal VDD_A and the third voltage terminal VDD_B described above, so that the potentials of the first pull-down node PD_1 and the second pull-down node PD_2 may be respectively controlled to be high levels alternately. When the first pull-down node PD_1 is at a high level, the first pull-down sub-circuit 60 pulls down the voltages of the pull-up node PU and the first signal output terminal Oput to the voltage of the first voltage terminal VGL under the control of the voltage of the first pull-down node PD_1. When the second pull-down node PD_2 is at a high level, the second pull-down sub-circuit 61 pulls down the voltages of the pull-up node PU and the first signal output terminal Oput to the voltage of the first voltage terminal VGL under the control of the voltage of the second pull-down node PD_2.

In some embodiments, in order to avoid that when a first signal output terminal Oput of a shift register circuit in a previous stage is connected to a signal input terminal Iput of a shift register circuit in a next stage, a signal output via the first signal output terminal Oput of the shift register circuit in the previous stage, which is affected by a gate line connected thereto, affects a signal output via the signal input terminal Iput of the shift register circuit in the next stage, in some embodiments, as shown in FIG. 2, the pull-up sub-circuit 20 is also connected to a second signal output terminal Oput_C, which is connected to a signal input terminal Iput of the shift register circuit in the next stage.

In this case, the pull-up sub-circuit 20 further includes a thirteenth transistor M13. The thirteenth transistor M13 includes a gate electrode, a first electrode and a second electrode. The gate electrode of the thirteenth transistor M13 is connected to the pull-up node PU, the first electrode of the thirteenth transistor M13 is connected to the clock signal terminal CLK, and the second electrode of the thirteenth transistor M13 is connected to the second signal output terminal Oput_C.

In some embodiments, the first pull-down sub-circuit 60 further includes a fourteenth transistor M14. The fourteenth transistor M14 includes a gate electrode, a first electrode and a second electrode. The gate electrode of the fourteenth transistor M14 is connected to the first pull-down node PD_1, the first electrode of the fourteenth transistor M14 is connected to the second signal output terminal Oput_C, and the second electrode of the fourteenth transistor M14 is connected to the first voltage terminal VGL.

In some other embodiments, in a case where the pull-up sub-circuit 20 is also connected to the second signal output terminal Oput_C, and the pull-up sub-circuit 20 further includes the thirteenth transistor M13, the second pull-down sub-circuit 61 further includes a fifteenth transistor M15. The fifteenth transistor M15 includes a gate electrode, a first electrode and a second electrode. The gate electrode of the fifteenth transistor M15 is connected to the second pull-down node PD_2, the first electrode of the fifteenth transistor M15 is connected to the second signal output terminal Oput_C, and the second electrode of the fifteenth transistor M15 is connected to the first voltage terminal VGL.

In some embodiments, as shown in FIG. 2, the shift register circuit described above further includes a second reset sub-circuit 70.

The second reset sub-circuit 70 is connected to a first sub-reset signal terminal RST, a second sub-reset signal terminal RST_C, the pull-up node PU, the first signal output terminal Oput and the first voltage terminal VGL. The second reset sub-circuit 70 is configured to pull down the voltage of the first signal output terminal Oput to the voltage of the first voltage terminal VGL under the control of a voltage from the first sub-reset signal terminal RST. In addition, the second reset sub-circuit 70 is further configured to pull down the voltage of the pull-up node PU to the voltage of the first voltage terminal VGL under the control of a voltage from the second sub-reset signal terminal RST_C.

In some embodiments, the second reset sub-circuit 70 includes a sixteenth transistor M16 and a seventeenth transistor M17.

The sixteenth transistor M16 includes a gate electrode, a first electrode and a second electrode. The gate electrode of the sixteenth transistor M16 is connected to the second sub-reset signal terminal RST_C, the first electrode of the sixteenth transistor M16 is connected to the pull-up node PU, and the second electrode of the sixteenth transistor M16 is connected to the first voltage terminal VGL.

The seventeenth transistor M17 includes a gate electrode, a first electrode and a second electrode. The gate electrode of the seventeenth transistor M17 is connected to the first sub-reset signal terminal RST, the first electrode of the seventeenth transistor M17 is connected to the first signal output terminal Oput, and the second electrode of the seventeenth transistor M17 is connected to the first voltage terminal VGL.

It will be noted that generally, the driving transistor Md in the pull-up sub-circuit 20 needs to drive a load. Therefore, a width-to-length ratio of the driving transistor Md is usually greater than width-to-length ratios of transistors in other sub-circuits. For example, the width-to-length ratio of the driving transistor Md is greater than a width-to-length ratio of the second transistor M2 in the first reset sub-circuit 40. Width-to-length ratios of relevant transistors in the embodiments of the present disclosure all refer to width-to-length ratios of channels of the transistors.

In a normal display process, when the pull-up node PU is required to be at a high level, in order to prevent the discharge transistor Mdc in the shutdown auxiliary sub-circuit 30 from affecting the potential of the pull-up node PU, in some embodiments, the width-to-length ratio of the discharge transistor Mdc is smaller than the width-to-length ratios of the remaining transistors except for the width-to-length ratio of the driving transistor Md, for example, the width-to-length ratio of the second transistor M2.

In some embodiments, the transistors in the sub-circuits described above are N-type transistors. In some other embodiments, the transistors in the sub-circuits described above are P-type transistors. Hereinafter, a description will be made by taking an example in which the transistors described above are all N-type transistors for convenience of description. The first electrodes of the transistors may be drain electrodes, and the second electrodes thereof may be source electrodes. Alternatively, the first electrodes of the transistors may be source electrodes, and the second electrodes thereof may be drain electrodes.

Hereinafter, based on the structure shown in FIG. 2, the working process of the shift register circuit in the normal display process will be described in detail by taking an example in which all the transistors shown in FIG. 2 are N-type transistors.

In a pre-charge phase, a high level is input via the signal input terminal Iput, and the first transistor M1 is turned on. The high level input via the signal input terminal Iput is transmitted to the pull-up node PU, and the pull-up node is pre-charged. Under the control of the voltage from the pull-up node PU, the thirteenth transistor M13 and the driving transistor Md are turned on. In this case, a low level is input via the clock signal terminal CLK, and low levels are output via the first signal output terminal Oput and the second signal output terminal Oput_C.

In a gate driving signal output phase, a low level is input via the signal input terminal Iput, and a high level is input via the clock signal terminal CLK. In this case, the potential of the pull-up node PU is further raised under the bootstrap action, the thirteenth transistor M13 and the driving transistor Md are remained in turned-on states, and high levels are output via the first signal output terminal Oput and the second signal output terminal Oput_C. The high level output via the first signal output terminal Oput is supplied to one row of sub-pixels through a gate line as a gate driving signal.

It will be seen from the above description that in the pre-charge phase and the gate driving signal output phase, the pull-up node PU is at a high level, and the discharge transistor Mdc is turned on. However, since the width and the length of the discharge transistor Mdc are relatively small, and durations of the pre-charge phase and the gate driving signal output phase are short (microsecond level) relative to the shutdown control phase Xon (millisecond level), in the normal display phase, the discharge transistor Mdc has little impact that may be ignored on the potential of the pull-up node PU.

After the gate driving signal output phase described above, high levels are input alternatively via the second voltage terminal VDD_A and the third voltage terminal VDD_B. When a high level is input via the second voltage terminal VDD_A, the first pull-down node PD_1 is at a high level. The sixth transistor M6, the seventh transistor M7 and the fourteenth transistor M14 are turned on, and the potentials of the pull-up node PU, the first signal output terminal Oput and the second signal output terminal Oput_C are respectively pulled down to low levels. When a high level is input via the third voltage terminal VDD_B, the second pull-down node PD_2 is at a high level. The eleventh transistor M11, the twelfth transistor M12 and the fifteenth transistor M15 are turned on, and the potentials of the pull-up node PU, the first signal output terminal Oput and the second signal output terminal Oput_C are pulled down to the voltage of the first voltage terminal VGL.

In addition, high levels are input via the first sub-reset signal terminal RST and the second sub-reset signal terminal RST_C, and the seventeenth transistor M17 and the sixteenth transistor M16 are turned on so that the potentials of the first signal output terminal Oput and the pull-up node PU are pulled down to the voltage of the first voltage terminal VGL.

Based on this, when a shutdown is required, in the shutdown control phase Xon, high levels are input via the signal input terminal Iput, the clock signal terminal CLK and the first voltage terminal VGL, and the discharge transistor Mdc is turned on. Then the potential of the pull-up node PU is slowly pulled down to the voltage of the discharge voltage terminal Vdc. Thereby, the potential of the pull-up node PU may be prevented from being in a bootstrapped state in the shutdown control phase Xon, so that the waveforms of the signals output via the first signal output terminals Oput of the shift register circuits are the same, thereby achieving a uniform discharge of rows of sub-pixels.

Figure 6:
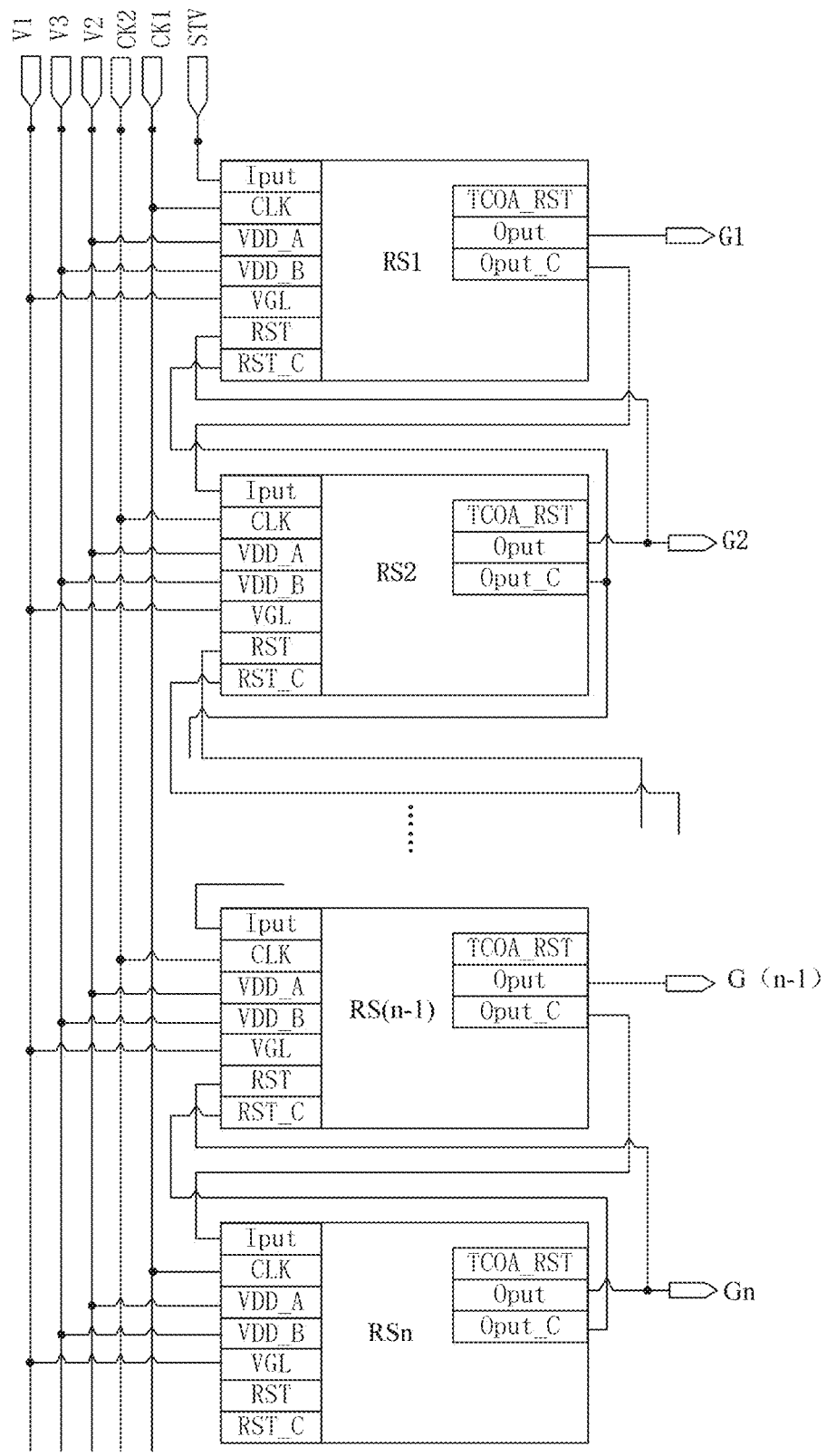
FIG. 6 is a schematic structural diagram of a gate driving circuit according to some embodiments of the present disclosure.

Some embodiments of the present disclosure provide a gate driving circuit which, as shown in FIG. 6, includes a plurality of cascaded shift register circuits (RS1, RS2, . . . , RSn), each of which is for example any one of shift register circuits described above, wherein n is a positive integer greater than or equal to 2. First signal output terminals Oput of the shift register circuits (RS1, RS2, . . . , RSn) are connected in one-to-one correspondence with the gate lines (G1, G2, . . . , Gn) located in the display region. In some embodiments, the shift register circuit shown in FIG. 2 is adopted.

A signal input terminal of a first-stage shift register circuit RS1 is configured to receive a start signal STV.

Except for the first-stage shift register circuit RS1, a second signal output terminal Oput_C of a shift register circuit in a previous stage is connected to a signal input terminal Iput of a shift register circuit in a next stage.

Except for a last-stage shift register circuit RSn, a first signal output terminal Oput of a shift register in a next stage is connected to a first sub-reset signal terminal RST of a shift register circuit in a previous stage. A second signal output terminal Oput_C of the shift register circuit in the next stage is connected to a second sub-reset signal terminal RST_C of the shift register circuit in the previous stage.

A first sub-reset signal terminal RST and a second sub-reset signal terminal RST_C of the last-stage shift register circuit are configured to receive reset signals respectively.

Based on this, clock signal terminals CLK of two adjacent shift register circuits are connected to different system clock signal terminals CK1 and CK2 respectively. For example, the clock signal terminal CLK of the first-stage shift register circuit RS1 is connected to the system clock signal terminal CK1, and the clock signal terminal CLK of the second-stage shift register circuit RS2 is connected to the system clock signal terminal CK2. Periods of a signal input via the system clock signal terminal CK1 and a signal input via the system clock signal terminal CK2 are the same, and the signal input via the system clock signal terminal CK1 and the signal input via the system clock signal terminal CK2 are a set of reverse signals. For example, if the signal input via the system clock signal terminal CK1 is a high level, the signal input via the system clock signal terminal CK2 is a low level; and if the signal input via the system clock signal terminal CK1 is a low level, the signal input via the system clock signal terminal CK2 is a high level. The connection manners of the clock signal terminals of the remaining shift register circuits are analogous. In addition, the second voltage terminal VDD_A and the third voltage terminal VDD_B are respectively connected to the system voltage terminals V2 and V3, and high levels are input alternately via the system voltage terminals V2 and V3. The first voltage terminal VGA is connected to the system voltage terminal V1.

The gate driving circuit described above has the same technical effects as the shift register circuit provided in the foregoing embodiments, and the technical effects will not be repeated herein.

Figure 7:
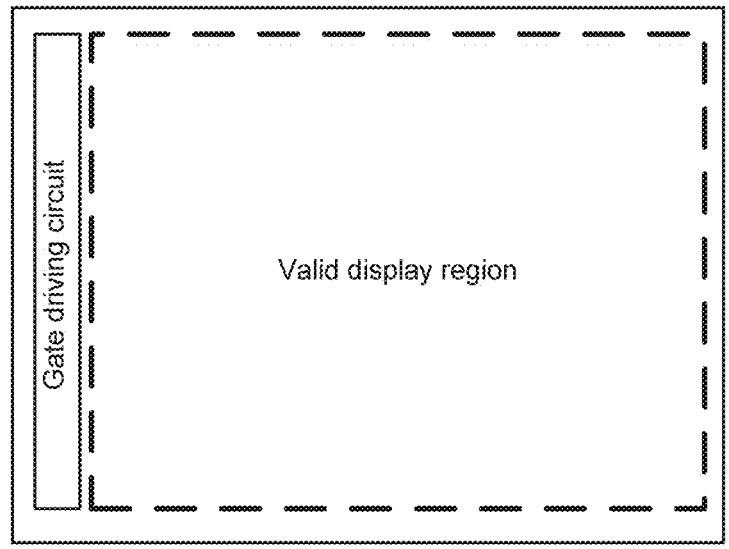
FIG. 7 is a schematic structural diagram of a display device according to some embodiments of the present disclosure.

Some embodiments of the present disclosure provide a display device which, as shown in FIG. 7, includes a gate driving circuit described above. The gate driving circuit in the display device has the same structure and advantageous effects as the gate driving circuit provided in the foregoing embodiments. Since the structure and advantageous effects of the gate driving circuit have been described in detail in the foregoing embodiments, they will not be repeated herein.

It will be noted that in some embodiments, the display device is a liquid crystal display device. In some other embodiments, the display device is an organic light-emitting diode display device. For example, the display device is any product or component having a display function such as a display, a television, a digital photo frame, a mobile phone, a car display screen or a tablet computer.

Figure 8:
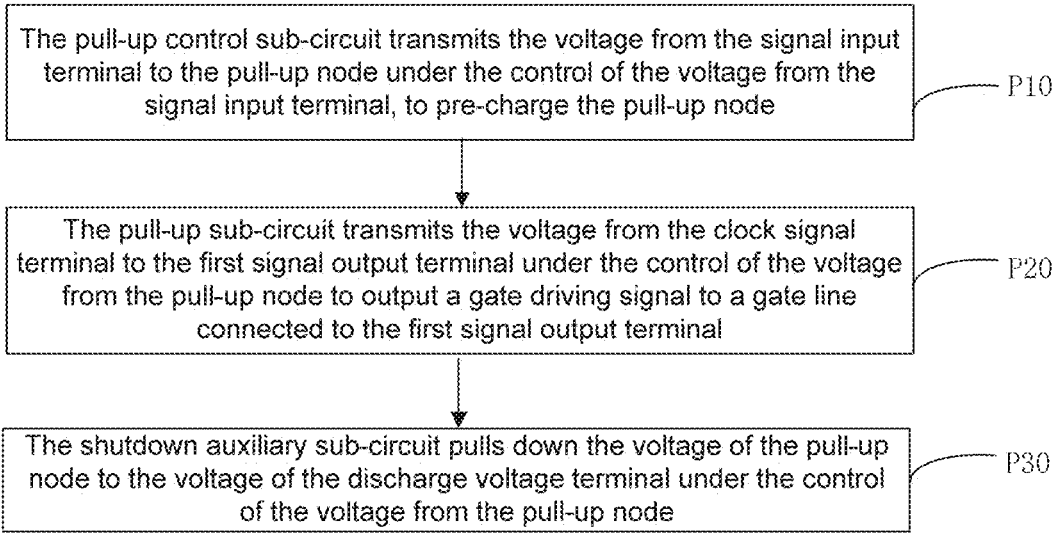
FIG. 8 is a flow chart of a method of controlling a shift register circuit according to some embodiments of the present disclosure.

Some embodiments of the present disclosure provide a method of controlling the shift register circuit as shown in FIG. 1 or 2. As shown in FIG. 8, the method includes a pre-charge phase P10, a gate driving signal output phase P20 and a shutdown control phase P30, in which the pre-charge phase P10 and the gate driving signal output phase P20 are included in an image frame of a display phase.

In the pre-charge phase P10, the pull-up control sub-circuit 10 transmits the voltage from the signal input terminal Iput to the pull-up node PU under the control of the voltage from the signal input terminal Iput, to pre-charge the pull-up node PU.

In the gate driving signal output phase P20, the pull-up sub-circuit 20 transmits the voltage from the clock signal terminal CLK to the first signal output terminal Oput under the control of the voltage from the pull-up node PU to output a gate driving signal to a gate line G connected to the first signal output terminal Oput.

In the shutdown control phase P30, the shutdown auxiliary sub-circuit 30 pulls down the voltage of the pull-up node PU to the voltage of the discharge voltage terminal Vdc under the control of the voltage from the pull-up node PU.

The structure of each of the sub-circuits is, for example, as shown in FIG. 2, and the turned-on and cut-off states of the transistors in the sub-circuits in the display phase or the shutdown control phase Xon are the same as above, which will not be repeated herein. In addition, the method of controlling the shift register circuit has the same technical effects as the shift register circuit provided in the foregoing embodiments, and the technical effects will not be repeated herein.

In order to solve the problem that the potentials of the pull-up nodes PU of some of the shift register circuits are bootstrapped in the shutdown control phase Xon, which leads to different discharge rates of rows of sub-pixels, some embodiments of the present disclosure provide another method of controlling the shift register circuit.

Figure 9:
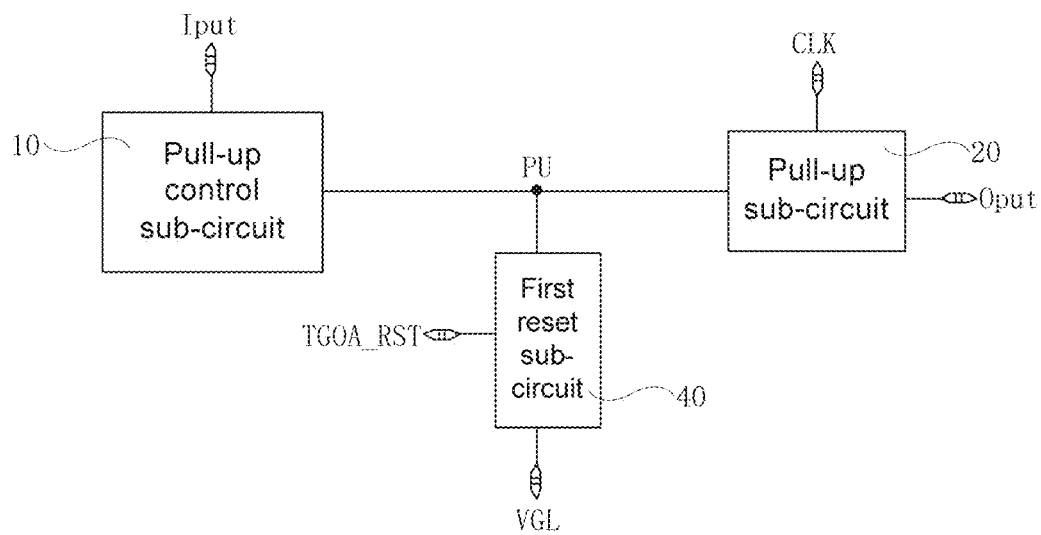
FIG. 9 is a schematic structural diagram of another shift register circuit according to some embodiments of the present disclosure.

As shown in FIG. 9, the shift register circuit includes a pull-up control sub-circuit 10, a pull-up sub-circuit 20 and a first reset sub-circuit 40.

The pull-up control sub-circuit 10 is connected to the signal input terminal Iput and the pull-up node PU. The pull-up sub-circuit 20 is connected to the clock signal terminal CLK, the pull-up node PU and the first signal output terminal Oput. The first reset sub-circuit 40 is connected to the general reset signal terminal TGOA_RST, the pull-up node PU and the first voltage terminal VGL. Structures of the pull-up control sub-circuit 10, the pull-up sub-circuit 20 and the first reset sub-circuit 40 are the same as the structures shown in FIG. 2, which will not be repeated herein.

Figure 10:
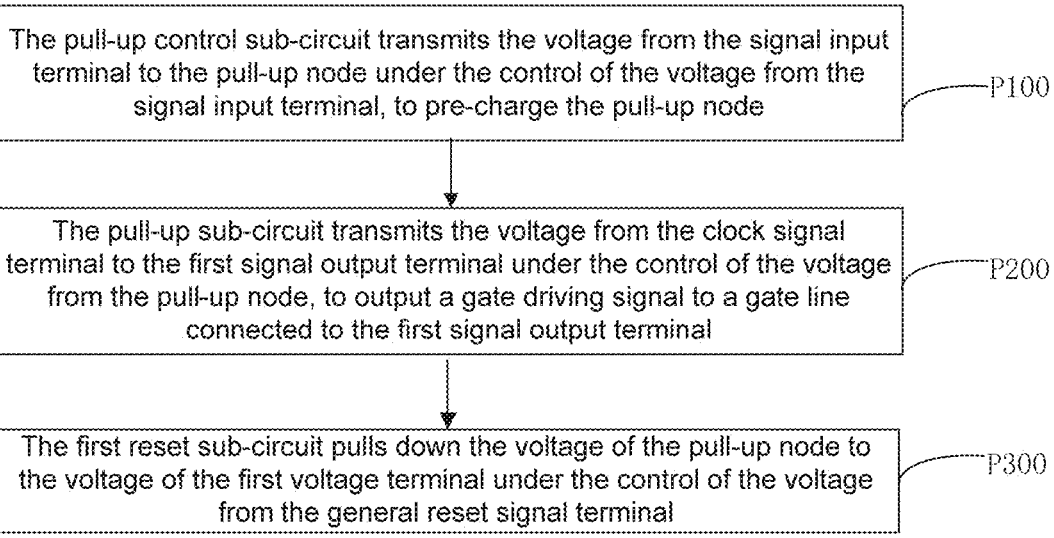
FIG. 10 is a flow chart of another method of controlling a shift register circuit according to some embodiments of the present disclosure.

In this case, as shown in FIG. 10, the method of controlling the shift register circuit described above includes a pre-charge phase P100, a gate driving signal output phase P200, and a phase S300 before a shutdown control phase Xon, and the three phases are included in an image frame of a display phase.

In the pre-charge phase P100, the pull-up control sub-circuit 10 transmits the voltage from the signal input terminal Iput to the pull-up node PU under the control of the voltage from the signal input terminal Iput, to pre-charge the pull-up node PU.

In the gate driving signal output phase P200, the pull-up sub-circuit 20 transmits the voltage from the clock signal terminal CLK to the first signal output terminal Oput under the control of the voltage from the pull-up node PU, to output a gate driving signal to a gate line connected to the first signal output terminal Oput.

When structures of the pull-up control sub-circuit 10 and the pull-up sub-circuit 20 are as shown in FIG. 2, the turned-on and cut-off states of the transistors in the pull-up control sub-circuit 10 and the pull-up sub-circuit 20 in the display phase or the shutdown control phase Xon are the same as above, which will not be repeated herein.

Figure 11:
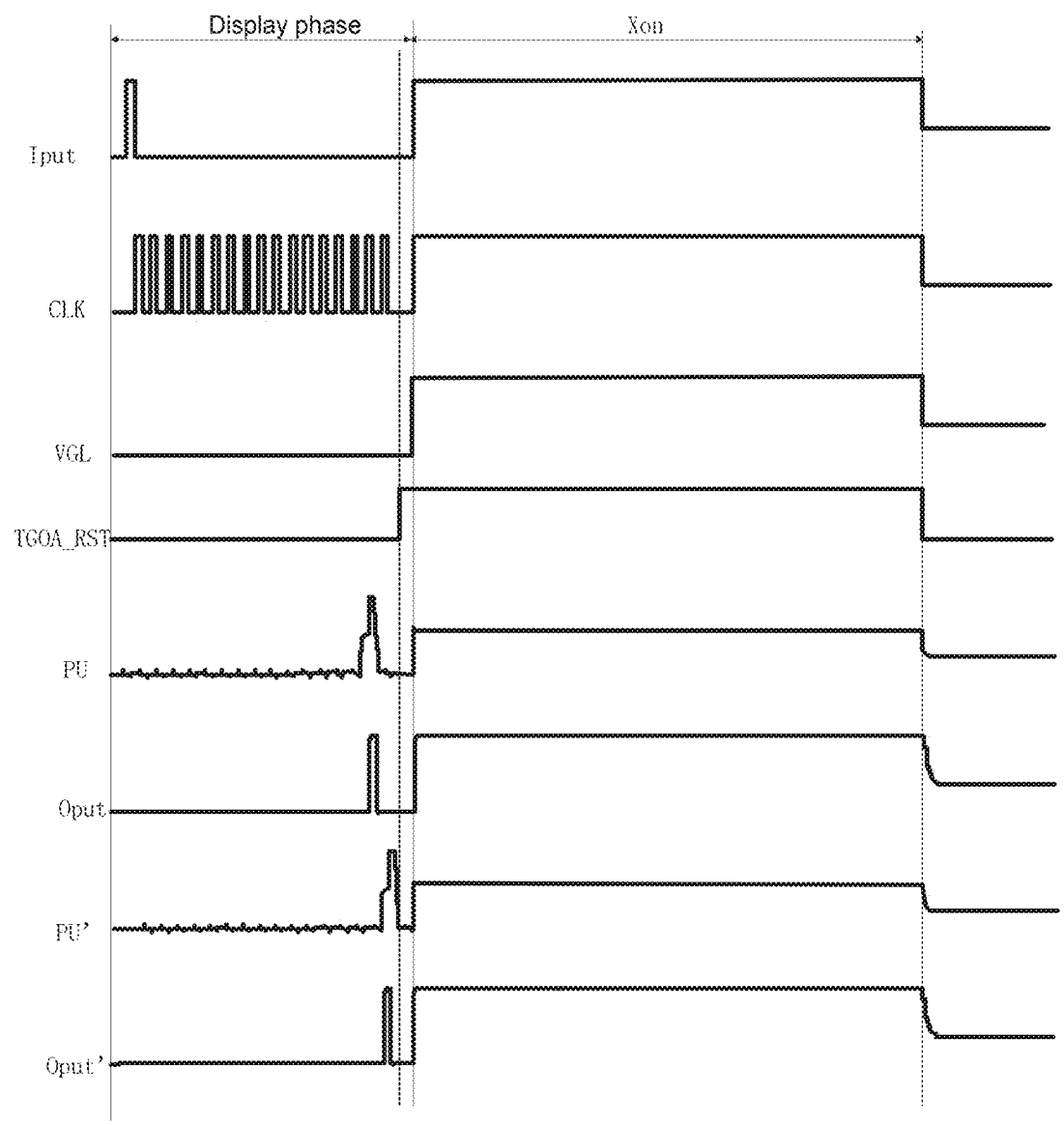
FIG. 11 shows timing diagrams of some of signals of controlling the shift register circuit shown in FIG. 9.

In the phase S300 before the shutdown control phase Xon, the first reset sub-circuit 40 pulls down the voltage of the pull-up node PU to the voltage of the first voltage terminal VGL under the control of the voltage from the general reset signal terminal TGOA_RST (referring to FIG. 11).

In this case, before the shutdown control phase Xon, the first reset sub-circuit 40 is controlled to be turned on by the voltage of the general reset signal terminal TGOA_RST, and thus as shown in FIG. 11, before the shutdown control phase Xon, a voltage of a pull-up node PU' in the shift register circuit in the pre-charge phase (i.e., a pre-charge phase) or the gate driving signal output phase (i.e., a gate driving circuit output phase) is pre-discharged, so that a potential of the pull-up node PU' is not bootstrapped in the shutdown control phase Xon.

In this case, it can be seen from FIG. 11 that by pre-discharging the pull-up node PU' before the shutdown control phase Xon, a waveform of the voltage of the pull-up node PU' is substantially the same as the waveform of the voltage of the pull-up node PU of the shift register circuit that is not in the pre-charge phase and the gate driving signal output phase before the shutdown control phase Xon. Therefore, regarding the method of controlling the shift register circuit shown in FIG. 9, regardless of the state of the display phase of each of the shift register circuits before the shutdown control phase Xon, in the shutdown control phase Xon, the waveforms of the voltages of the pull-up nodes PU in the shift register circuits are substantially the same.

Based on this, it can be seen from FIG. 11 that before the shutdown control phase Xon, regardless of whether the shift register circuit is in the pre-charge phase and the gate driving signal output phase, in the shutdown control phase Xon, the waveforms of the signals output via the first signal output terminals Oput (corresponding to the pull-up node PU) of the shift register circuits or waveforms of signals output via first signal output terminals Oput' (corresponding to the pull-up node PU') are substantially the same, thereby making the discharge speeds of the rows of sub-pixels uniform.

It will be understood by a person skilled in the art that all or part of the steps of implementing the above method embodiments may be completed by hardware related to program instructions. The foregoing program instructions may be stored in a computer readable storage medium, and when performed, steps including the steps in the above method embodiments are performed. The foregoing storage medium includes various media that can store program codes, such as a ROM, a RAM, a magnetic disk or an optical disk.

The foregoing descriptions are merely some implementation manners of the present disclosure, but the protection scope of the present disclosure is not limited thereto, and the changes or replacements that any person skilled in the art can easily think of in the technical scope disclosed by the present disclosure should be within the protection scope of the present disclosure. Therefore, the protection scope of the present disclosure shall be subject to the protection scope of the claims.

What is claimed is:

1. A shift register circuit, comprising:
   a pull-up control sub-circuit connected to a signal input terminal and a pull-up node, wherein the pull-up control sub-circuit is configured to transmit a voltage from the signal input terminal to the pull-up node under control of the voltage from the signal input terminal;
   a shutdown auxiliary sub-circuit connected to the pull-up node and a discharge voltage terminal, wherein the shutdown auxiliary sub-circuit is configured to pull down a voltage of the pull-up node to a voltage of the discharge voltage terminal under control of the voltage from the pull-up node in a shutdown control phase, the discharge voltage terminal is connected to a ground terminal;
   a pull-up sub-circuit connected to a clock signal terminal, the pull-up node, a first signal output terminal and a second signal output terminal, wherein the pull-up sub-circuit is configured to transmit a voltage from the clock signal terminal to the first signal output terminal under control of a voltage from the pull-up node, and the first signal output terminal is configured to be connected to a gate line;
   a first reset sub-circuit connected to a general reset signal terminal, the pull-up node and a first voltage terminal, wherein the first reset sub-circuit is configured to pull down a voltage of the pull-up node to a voltage of the first voltage terminal under control of a voltage from the general reset signal terminal;
   a second reset sub-circuit connected to a first sub-reset signal terminal, a second sub-reset signal terminal, the pull-up node, the first signal output terminal and the first voltage terminal, wherein the second reset sub-circuit is configured to pull down a voltage of the first signal output terminal to a voltage of the first voltage terminal under control of a voltage from the first sub-reset signal terminal, and the second reset sub-circuit is further configured to pull down a voltage of the pull-up node to a voltage of the first voltage terminal under control of a voltage from the second sub-reset signal terminal;
   a first pull-down control sub-circuit connected to a second voltage terminal, the signal input terminal, the pull-up node, a first pull-down node and the first voltage terminal, wherein the first pull-down control sub-circuit is configured to transmit a voltage from the second voltage terminal to the first pull-down node under control of the voltage from the second voltage terminal, and the first pull-down control sub-circuit is further configured to pull down a voltage of the first pull-down node to a voltage of the first voltage terminal under control from a voltage from the signal input terminal or a voltage from the pull-up node;
   a second pull-down control sub-circuit connected to a third voltage terminal, the signal input terminal, the pull-up node, a second pull-down node and the first voltage terminal, wherein the second pull-down control sub-circuit is configured to transmit a voltage from the third voltage terminal to the second pull-down node under control of the voltage from the third voltage terminal, and the second pull-down control sub-circuit is further configured to pull down a voltage of the second pull-down node to a voltage of the first voltage terminal under control of a voltage from the signal input terminal or a voltage from the pull-up node;
   a first pull-down sub-circuit connected to the pull-up node, the first signal output terminal, a first voltage terminal and the first pull-down node, wherein the first pull-down sub-circuit is configured to pull down voltages of the pull-up node and the first signal output terminal to a voltage of the first voltage terminal under control of a voltage from the first pull-down node;
   a second pull-down sub-circuit connected to the pull-up node, the first signal output terminal, a first voltage terminal and the second pull-down node, wherein the second pull-down sub-circuit is configured to pull down voltages of the pull-up node and the first signal output terminal to a voltage of the first voltage terminal under control of a voltage from the second pull-down node;
   wherein the pull-up control sub-circuit comprises a first transistor, a gate electrode and a first electrode of the first transistor are connected to the signal input terminal, and a second electrode of the first transistor is connected to the pull-up node;

wherein the second pull-down control sub-circuit comprises an eighth transistor, a ninth transistor and a tenth transistor;

a gate electrode and a first electrode of the eighth transistor are connected to the third voltage terminal, and a second electrode of the eighth transistor is connected to the second pull-down node;

a gate electrode of the ninth transistor is connected to the signal input terminal, a first electrode of the ninth transistor is connected to the second pull-down node, and a second electrode of the ninth transistor is connected to the first voltage terminal;

a gate electrode of the tenth transistor is connected to the pull-up node, a first electrode of the tenth transistor is connected to the second pull-down node, and a second electrode of the tenth transistor is connected to the first voltage terminal;

wherein the first reset sub-circuit comprises a second transistor, a gate electrode of the second transistor is connected to the general reset signal terminal, a first electrode of the second transistor is connected to the pull-up node, and a second electrode of the second transistor is connected to the first voltage terminal;

wherein the first pull-down control sub-circuit comprises a third transistor, a fourth transistor and a fifth transistor;

a gate electrode and a first electrode of the third transistor are connected to the second voltage terminal, and a second electrode of the third transistor is connected to the first pull-down node;

a gate electrode of the fourth transistor is connected to the signal input terminal, a first electrode of the fourth transistor is connected to the first pull-down node, and a second electrode of the fourth transistor is connected to the first voltage terminal;

a gate electrode of the fifth transistor is connected to the pull-up node, a first electrode of the fifth transistor is connected to the first pull-down node, and a second electrode of the fifth transistor is connected to the first voltage terminal;

wherein the second reset sub-circuit comprises a sixteenth transistor and a seventeenth transistor; a gate electrode of the sixteenth transistor is connected to the second sub-reset signal terminal, a first electrode of the sixteenth transistor is connected to the pull-up node, and a second electrode of the sixteenth transistor is connected to the first voltage terminal; and a gate electrode of the seventeenth transistor is connected to the first sub-reset signal terminal, a first electrode of the seventeenth transistor is connected to the first signal output terminal, and a second electrode of the seventeenth transistor is connected to the first voltage terminal;

wherein the pull-up sub-circuit comprises a driving transistor, a storage capacitor and a thirteenth transistor; a gate electrode of the driving transistor is connected to the pull-up node, a first electrode of the driving transistor is connected to the clock signal terminal, and a second electrode of the driving transistor is connected to the first signal output terminal; one end of the storage capacitor is connected to the gate electrode of the driving transistor, and another end of the storage capacitor is connected to the second electrode of the driving transistor; a gate electrode of the thirteenth transistor is connected to the pull-up node, a first electrode of the thirteenth transistor is connected to the clock signal terminal, and a second electrode of the thirteenth transistor is connected to the second signal output terminal;

wherein the first pull-down sub-circuit comprises a sixth transistor, a seventh transistor and a fourteenth transistor; a gate electrode of the sixth transistor is connected to the first pull-down node, a first electrode of the sixth transistor is connected to the pull-up node, and a second electrode of the sixth transistor is connected to the first voltage terminal; a gate electrode of the seventh transistor is connected to the first pull-down node, a first electrode of the seventh transistor is connected to the first signal output terminal, and a second electrode of the seventh transistor is connected to the first voltage terminal; a gate electrode of the fourteenth transistor is connected to the first pull-down node, a first electrode of the fourteenth transistor is connected to the second signal output terminal, and a second electrode of the fourteenth transistor is connected to the first voltage terminal;

wherein the second pull-down sub-circuit comprises an eleventh transistor, a twelfth transistor and a fifteenth transistor; a gate electrode of the eleventh transistor is connected to the second pull-down node, a first electrode of the eleventh transistor is connected to the pull-up node, and a second electrode of the eleventh transistor is connected to the first voltage terminal;

and a gate electrode of the twelfth transistor is connected to the second pull-down node, a first electrode of the twelfth transistor is connected to the first signal output terminal, and a second electrode of the twelfth transistor is connected to the first voltage terminal; a gate electrode of the fifteenth transistor is connected to the second pull-down node, a first electrode of the fifteenth transistor is connected to the second signal output terminal, and the second electrode of the fifteenth transistor is connected to the first voltage terminal; and wherein the shutdown auxiliary sub-circuit comprises a discharge transistor, a gate electrode and a first electrode of the discharge transistor are connected to the pull-up node, a second electrode of the discharge transistor is connected to the discharge voltage terminal, and a width-to-length ratio of the discharge transistor is smaller than a width-to-length ratio of the second transistor.

2. A gate driving circuit, comprising a plurality of cascaded shift register circuits according to claim 1, wherein the signal input terminal of a first-stage shift register circuit is configured to receive a start signal;

except for the first-stage shift register circuit, a second signal output terminal of a shift register circuit in a previous stage is connected to a signal input terminal of a shift register circuit in a next stage;

except for a last-stage shift register circuit, a first signal output terminal of a shift register circuit in a next stage is connected to a first sub-reset signal terminal of a shift register circuit in a previous stage; a second signal output terminal of the shift register circuit in the next stage is connected to a second sub-reset signal terminal of the shift register circuit in the previous stage; and a first sub-reset signal terminal and a second sub-reset signal terminal of the last-stage shift register circuit is configured to receive reset signals.

3. A display device, comprising the gate driving circuit according to claim 2.

4. A method of controlling the shift register circuit according to claim 1, the method comprising:

in an image frame of a display phase:
in a pre-charge phase, transmitting, by the pull-up control sub-circuit, a voltage from the signal input terminal to the pull-up node under control of the voltage from the signal input terminal;
in a gate driving signal output phase, transmitting, by the pull-up sub-circuit, a voltage from the clock signal terminal to the first signal output terminal under control of a voltage from the pull-up node; and
after the gate driving signal output phase and before a next pre-charge phase, pulling down, by the second reset sub-circuit, a voltage of the first signal output terminal to a voltage of the first voltage terminal under control of a voltage from the first sub-reset signal terminal, and pulling down, by the second reset sub-circuit, a voltage of the pull-up node to a voltage of the first voltage terminal under control of a voltage from the second sub-reset signal terminal;
in a phase before a shutdown control phase, pulling down, by the first reset sub-circuit, a voltage of the pull-up node to a voltage of the first voltage terminal under control of a voltage from the general reset signal terminal; and
in the shutdown control phase:
pulling down, by the shutdown auxiliary sub-circuit, a voltage of the pull-up node to a voltage of the discharge voltage terminal under control of the voltage from the pull-up node.

* * * * *